(12) United States Patent
Nguyen et al.

(10) Patent No.: US 7,245,240 B1
(45) Date of Patent: Jul. 17, 2007

(54) INTEGRATED CIRCUIT SERIALIZERS WITH TWO-PHASE GLOBAL MASTER CLOCKS

(75) Inventors: Toan Thanh Nguyen, San Jose, CA (US); Thungoc M. Tran, San Jose, CA (US); Sergey Shumarayev, San Leandro, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/370,727

(22) Filed: Mar. 7, 2006

(51) Int. Cl.
*H03M 9/00* (2006.01)

(52) U.S. Cl. .................. 341/100; 341/101; 326/46; 326/93; 327/258; 327/295; 327/296; 327/297

(58) Field of Classification Search ......... 341/100–101
See application file for complete search history.

(56) References Cited

U.S. PATENT DOCUMENTS

| | | | |
|---|---|---|---|
| 4,398,225 A | | 8/1983 | Cornaby et al. |
| 4,926,423 A | * | 5/1990 | Zukowski ............ 370/540 |
| 5,689,731 A | | 11/1997 | West et al. |
| 5,867,046 A | * | 2/1999 | Sugasawa ............ 327/258 |
| 6,189,115 B1 | | 2/2001 | Whetsel |
| 6,326,813 B2 | * | 12/2001 | Lindsay ............ 326/93 |
| 6,696,995 B1 | * | 2/2004 | Foley et al. ............ 341/100 |
| 6,724,328 B1 | * | 4/2004 | Lui et al. ............ 341/101 |
| 6,788,127 B2 | * | 9/2004 | Sato ............ 327/407 |
| 6,886,106 B2 | | 4/2005 | Brock et al. |
| 6,970,116 B2 | | 11/2005 | Masaki |
| 7,006,021 B1 | * | 2/2006 | Lombaard ............ 341/100 |
| 7,106,227 B2 | * | 9/2006 | Karlquist ............ 341/101 |
| 2002/0114416 A1 | * | 8/2002 | Enam et al. ............ 375/373 |
| 2006/0202875 A1 | * | 9/2006 | Fujisawa ............ 341/100 |

* cited by examiner

*Primary Examiner*—Khai M. Nguyen
(74) *Attorney, Agent, or Firm*—G. Victor Treyz

(57) ABSTRACT

Integrated circuit serializer circuitry is provided that converts parallel data to serial data on an integrated circuit. A two-phase global serializer master clock generator uses a four-phase internal clock to generate a two-phase global serializer master clock. The two-phase global serializer master clock is distributed globally on the integrated circuit using a distribution path. The integrated circuit has multiple serial communications channels each of which has an associated serializer. Each serializer contains circuitry that derives a number of clock signals from the two phases of the global serializer master clock. Each serializer uses the derived clocks in converting parallel data to serial data for transmission over its associated serial communications channel. The serializers each contain two smaller serializers that convert first and second sets of parallel data to first and second serial outputs. A 2:1 serializer in each serializer merges the first and second serial outputs.

20 Claims, 12 Drawing Sheets

INTEGRATED CIRCUIT SERIALIZERS WITH TWO-PHASE GLOBAL MASTER CLOCKS

BACKGROUND

This invention relates to serializer circuitry for integrated circuits such as programmable logic device integrated circuits, and more particularly, to integrated circuits and serializer circuitry with two-phase serializer master clock generators.

Serial communications links are often used in modern electronics systems. Serial communications links use fewer pins than parallel links, and, particularly when differential signaling schemes are used, serial links support high speeds and exhibit good noise immunity.

Digital integrated circuits typically handle internal data processing functions using parallel data. For example, one logic circuit on a digital integrated circuit may provide data to another logic circuit over an eight bit or sixteen bit bus.

When it is desired to transmit parallel data from a digital integrated circuit to another integrated circuit over a serial link, the parallel data must be converted to a serial format. Parallel-to-serial data conversion is handled using serializers. A serializer has multiple inputs that receive parallel data from a data bus. The serializer converts the parallel data on its inputs to serial data. The serial data is provided on an output. In a typical arrangement, the serial data on the output is provided to a differential output driver that transmits the serial data to a receiver over a differential signal path.

As integrated circuits become more complex, there is an interest in supporting increasingly large serial link data rates. However, the timing margins provided by conventional serializer architectures may not be sufficient to reliably compensate for clock skew and jitter in high data-rate environments.

It is therefore an object of the present invention to provide ways in which to implement robust serializer circuitry for integrated circuits such as programmable logic device integrated circuits.

SUMMARY

Integrated circuit serializer circuitry and methods for performing parallel-to-serial data conversion are provided. An integrated circuit may use a clock generation circuit to generate a four-phase internal clock from a reference clock. The four-phase internal clock is provided to a two-phase global serializer master clock generator.

The two-phase global serializer master clock generator produces two global serializer master clock signals. The two global serializer master clock signals and two synchronized phases of the four-phase clock are globally distributed to serializers associated with multiple serial communications channels.

The serializer associated with each channel contains two smaller serializers that operate in parallel. These two smaller serializers are sometimes referred to as odd and even serializers. The odd and even serializers each contain an associated bank of registers. The registers in the even bank of registers are clocked using clock signals that are derived from a first phase of the two-phase global serializer master clock. The registers in the odd bank are clocked using clock signals the are derived from a second phase of the two-phase global serializer master clock. The outputs of the odd and even serializers in each channel are merged using a 2:1 serializer to produce the serializer output for that channel.

Further features of the invention, its nature and various advantages will be more apparent from the accompanying drawings and the following detailed description of the preferred embodiments.

DETAILED DESCRIPTION

The present invention relates to serializers. Serializers, which are also sometimes referred to as parallel-to-serial converters or multiplexers, convert parallel data to serial data. Serializer clock generation circuitry is used to produce a two-phase global serializer master clock. Serializer circuitry uses the two phases of the global serializer master clock to serialize parallel data on an integrated circuit. The circuitry of the present invention may be used on any integrated circuit that contains a source of parallel data and circuitry that consumes serial data such as serial data communications circuitry. These integrated circuits may be, for example, microprocessors, digital signal processors, application specific integrated circuits, or programmable logic device integrated circuits.

Programmable logic devices are integrated circuits that can be configured by a user to perform custom logic functions. Programmable logic devices are configured ("programmed") by loading configuration data into the device. The configuration data is used to program the device's programmable elements. Once the programmable elements have been configured, they are used to produce static control signals that selectively turn on and off components of the device's circuitry and thereby customize the logic on the device.

Although the present invention may be used in the context of any integrated circuit that has serializer circuitry, the invention is sometimes described in the context of programmable logic devices as an example.

Figure 1:
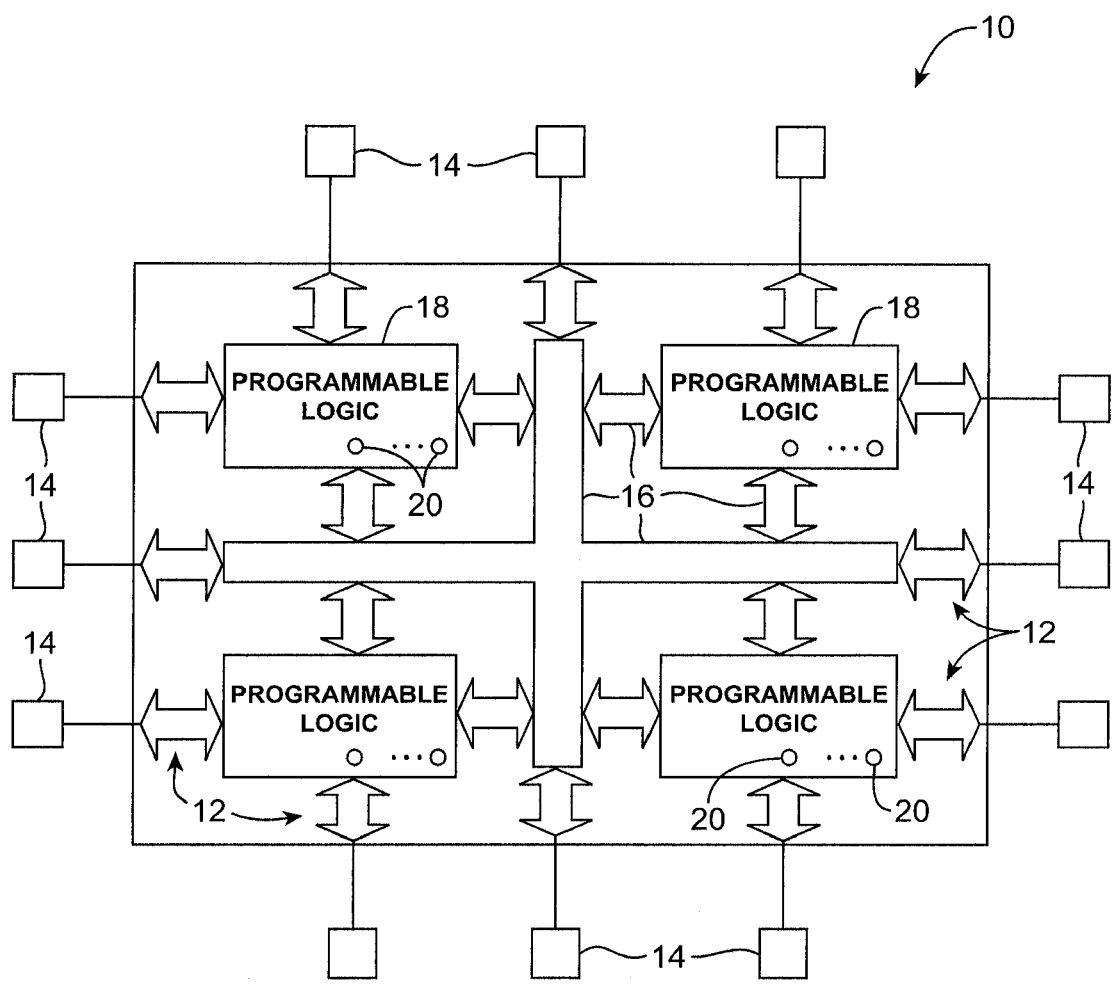
FIG. 1 is a diagram of an illustrative programmable logic device integrated circuit in accordance with the present invention.

An illustrative programmable logic device 10 that may contain clock generation and serializer circuitry in accordance with the present invention is shown in FIG. 1.

Programmable logic device 10 may have input-output circuitry 12 for driving signals off of device 10 and for receiving signals from other devices via input-output pins 14. Pins 14 may be any suitable types of pins or solder bumps for making electrical connections between the internal circuitry of device 10 and external packaging. Some of the pins 14 may be used for high-speed communications signals. For example, some of the pins may be used to transmit serialized output data. Other pins may be used to provide power supply voltages to the device 10 or may be used for DC or low-frequency signals.

Interconnection resources 16 such as global and local vertical and horizontal conductive lines and buses may be used to route signals on device 10. The remainder of the circuitry 18 on device 10 includes blocks of programmable logic, memory blocks, regions of digital signal processing circuitry, processors, hardwired circuits for supporting complex communications and arithmetic functions, etc. The programmable logic in circuitry 18 may include combinational and sequential logic circuitry including logic gates, multiplexers, switches, memory blocks, look-up-tables, logic arrays, etc. These illustrative components are not mutually exclusive. For example, look-up tables and other components that include logic gates and switching circuitry can be formed using multiplexers.

Device 10 contains programmable elements that are loaded with configuration data during programming operations. The programmable elements may be based on random-access memory (RAM) cells, flash memory cells, EEPROM memory cells, memory cells based on fuses or antifuses, or other suitable devices that are programmed by loading configuration data. Mask-programmed memory elements may also be used. Once programmed, the programmable elements provide static control signals that are applied to the terminals (e.g., the gates) of circuit elements (e.g., metal-oxide-semiconductor transistors) in the programmable logic of circuitry 18 to control those elements (e.g., to turn certain transistors on or off) and thereby configure programmable logic device 10. Programmable logic circuit elements in input/output circuitry 12 and interconnection resources 16 are also generally configured by the programmable element outputs as part of the programming process (e.g., to customize I/O and routing functions). The circuit elements that are configured in input/output circuitry 12, interconnection resources 16, and circuitry 18 may be transistors such as pass transistors or parts of multiplexers, look-up tables, logic arrays, AND, OR, NAND, and NOR logic gates, etc. Illustrative programmable elements are shown schematically as elements 20 in FIG. 1.

The circuitry of device 10 may be organized using any suitable architecture. As an example, the logic of programmable logic device 10 may be organized in a series of rows and columns of larger programmable logic regions or areas each of which contains multiple smaller logic regions or areas (e.g., areas of logic based on look-up tables or macrocells). These logic resources may be interconnected by interconnection resources 16 such as associated vertical and horizontal interconnection conductors. Interconnection conductors may include global conductive lines that span substantially all of device 10, fractional lines such as half lines or quarter lines that span part of device 10, staggered lines of a particular length (e.g., sufficient to interconnect several logic areas), smaller local lines that interconnect small logic regions in a given portion of device 10, or any other suitable interconnection resource arrangement. If desired, the logic of device 10 may be arranged in more hierarchical levels or layers in which multiple large areas are interconnected to form still larger portions of logic. Still other device arrangements may use logic that is not arranged in rows and columns. Portions of device 10 (e.g., in input/output circuitry 12 and elsewhere) may be hardwired for efficiency. As an example, hardwired digital signal processing circuitry (e.g., multipliers, adders, etc.) may be used.

The primary processing circuitry of integrated circuits such as integrated circuit 10 of FIG. 1 is located in the central region of the device. Input-output circuitry 12 is typically located around the periphery of the integrated circuit. The central region of the device is sometimes referred to as the core of the device and the circuitry in that region is sometimes referred to as core circuitry or core logic.

The core logic handles both serial and parallel data. Parallel data arrangements are generally used whenever significant amounts of data are involved. For example, if a complex core process produces large quantities of data, the data will typically be handled in parallel using parallel data buses. The buses may have any suitable width. The width of the buses may be, for example, 8-bits, 10 bits, 12 bits, 16 bits, 20 bits, 24 bits, 32 bits, 64 bits, etc.

Although data is sometimes conveyed between integrated circuits in parallel, parallel chip-to-chip communications consume large numbers of pins and require the use of parallel circuit board buses. When parallel data is transmitted between boards, parallel data cables are required. To avoid the disadvantages associated with using parallel chip-to-chip communications arrangements, input-output circuitry such as input-output circuitry 12 of FIG. 12 generally contains serial communications circuitry. The serial communications circuitry allows device 10 to support high-speed data communications over serial communications links.

The serial communications circuitry contains output drivers for driving signals off of device 10 and input drivers for receiving serial data signals from other integrated circuits. A typical serial communications link contains a bidirectional data path. Multilane serial communications links support larger link bandwidths by combining multiple serial paths in parallel.

Serial communications links may use differential signaling schemes in which a pair of signals are referenced to each other or single-ended signaling schemes in which data signals are referenced to ground. Integrated circuits may contain a mix of single-ended and differential output drivers or may use exclusively one type of output driver. In some programmable logic devices, the input-output circuitry is configurable. Configurable output drivers may be configured to operate as single-ended drivers or as differential output drivers.

Regardless of the type of output driver circuitry that is used, there is a need to convert the parallel core logic data into serial data. A circuit that converts parallel data to a serial format is called a serializer. Serializers, which are sometimes referred to as parallel-to-serial converters or multiplexers, convert parallel data into serial data using time-division multiplexing. During operation of the serializer, slower parallel data signals on the serializer's inputs are merged to form a single higher-rate serial data signal on the serializer's output. As an example, a 10:1 serializer converts ten parallel 1 Gbps data streams into a single serial data stream operating at 10 Gbps.

Because of the high data rates that are commonly involved in operating serializers, it is necessary for serializer circuitry to satisfy stringent timing constraints. Unless these timing constraints are satisfied, clock skew and jitter can lead to errors in the parallel-to-serial conversion process. As higher data rates are demanded by system designers, conventional serializer architectures are unable to ensure sufficient timing margins, making high-speed operation of conventional serializers error prone or impractical.

The serializer architecture of the present invention use a two-phase global serializer master clock that increases timing margins and ensures that serializer operation will be supported at high data rates.

Figure 2:
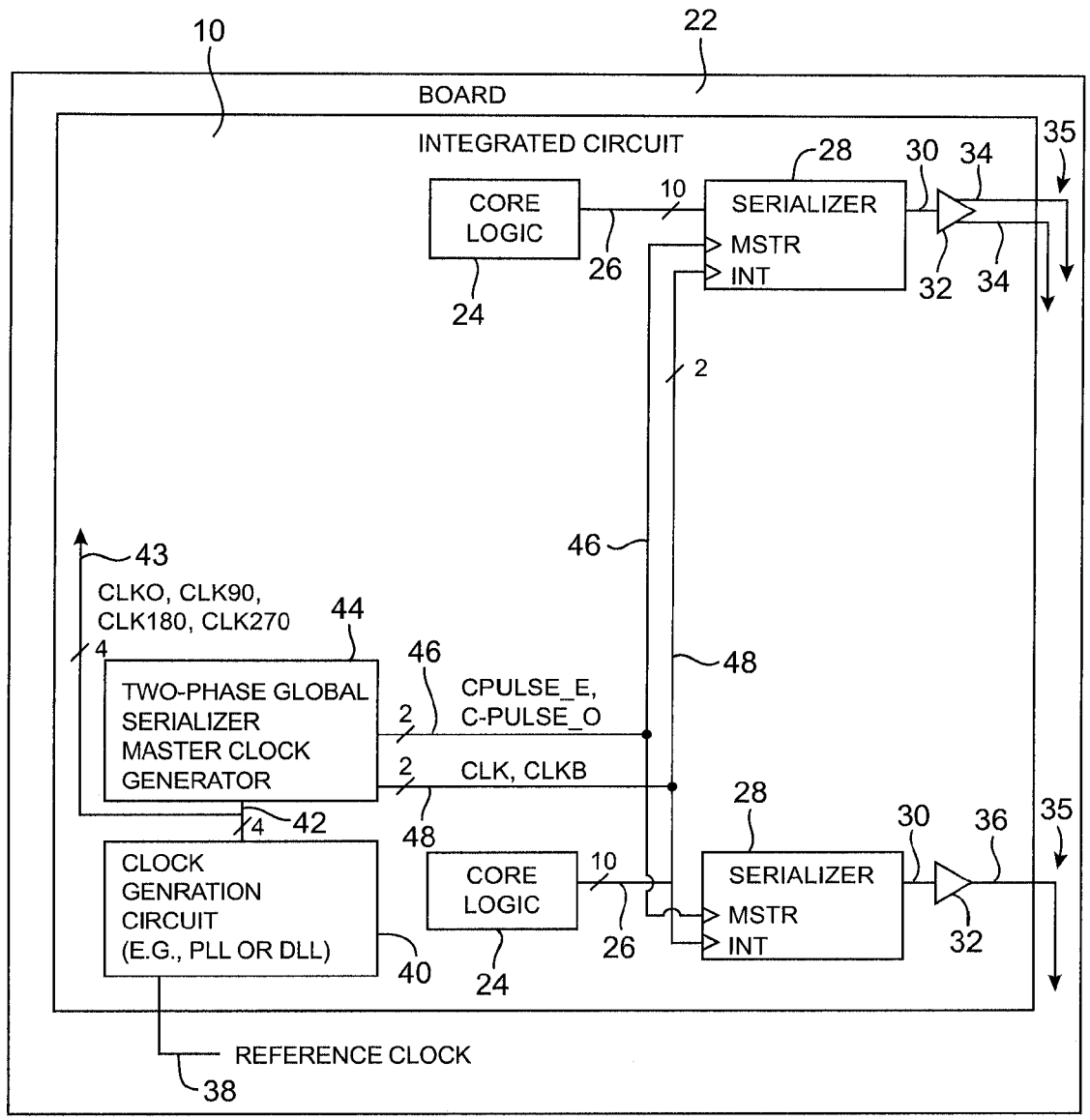
FIG. 2 is a diagram of a system environment in which an integrated circuit containing serializer circuitry and a two-phase global serializer master clock generator may be used in accordance with the present invention.

A system environment in which an integrated circuit using the serializer architecture of the present invention may be used is shown in FIG. 2. As shown in FIG. 2, an integrated circuit 10 such as a programmable logic device integrated circuit or other suitable integrated circuit may be mounted on a system board 22. System board 22 may contain a number of integrated circuits and may be interconnected with other system boards in a larger system.

Integrated circuit 10 may include core logic 24 (e.g., programmable logic 18 of FIG. 1) that produces parallel data on output lines 26. In the example of FIG. 2, each portion of core logic 24 is shown as generating parallel data on 10 parallel lines 26. In general, a given integrated circuit 10 may produce any suitable type of parallel data. For example, some core logic may produce parallel data on 8-bit buses, whereas other core logic produces parallel data on 16-bit buses. The use of 10-bit wide data buses such as paths 26 in the example of FIG. 2 is merely illustrative.

Parallel data signals on paths 26 are received at the inputs of respective serializers 28. In a typical integrated circuit, there may be multiple serial data channels, each having a corresponding serializer 28. In this type of arrangement, each serializer operates independently from the other. The serializers, which may be arranged around the periphery of the device 10, receive a common two-phase global serializer master clock. The use of the two-phase global serializer master clock enables reliable high speed serializer operation.

The serializer 28 in each serial communications channel converts the parallel data on its inputs into corresponding serial data on its output 30. The serial data on output 30 is provided to a corresponding output driver 32. Outputs such as outputs 30 in FIG. 2 are generally single-ended. Output drivers 32 may be differential output drivers that convert single-ended serial data on lines 30 into differential serial data on a pair of corresponding differential output lines such as differential lines 34 of FIG. 2. If desired, output drivers 32 may be single-ended output drivers that drive serial data from their inputs onto corresponding single-ended output lines such as line 36 of FIG. 2. Traces on board 22 are connected to the outputs of the output drivers 32 through input-output pins 14 on integrated circuit 10. The traces form high-speed serial communications paths 35 between integrated circuit 10 and other integrated circuits. The serial communications paths 35 convey the serial data from the outputs of output drivers 32 to input drivers on the other integrated circuits. These other integrated circuits receive incoming serial data from paths 35 using input buffers and serial-to-parallel data converters. In bidirectional links, the receiving circuits contain serializers and output buffers that transmit data back to the integrated circuit 10.

The serializers of FIG. 2 are 10:1 serializers, because they each convert 10 parallel input data signals to a single serial data output. If desired, serializers 28 may be 8:1 serializers, 16:1 serializers, 20:1 serializers, or may support any other suitable parallel-to-serial conversion ratio.

The integrated circuit 10 has at clock input 38 at which a reference clock is received. The speed that is used for the reference clock is generally dictated by system considerations. As an example, a reference clock might operate at 100 MHz or 400 MHz. Other values may be used if desired. In a typical scenario, a crystal oscillator in the system generates the reference clock, which is distributed to all of the boards 22 in the system through a system backplane. Each board 22 receives the reference clock and distributes the reference clock to the integrated circuits on the board through a set of clock path traces.

Integrated circuit 10 includes a clock generation circuit 40 that receives the reference clock signal provided on clock input 38. The clock generation circuit may be based on a phase-locked loop circuit, a delay-locked loop circuit, or any other suitable clock generation circuit architecture.

The clock generation circuit 40 uses the reference clock to generate a corresponding set of internal clock signals for use in operating the internal circuitry on integrated circuit 10. The internal clock may slower than the reference clock, may have the same frequency as the reference clock, or may be faster than the reference clock. As an example, the reference clock might be 400 MHz and the internal clock might have a frequency of approximately 3 to 6 GHz. As another example, the reference clock might be a 100 MHz clock, whereas the internal clock produced by the clock generation circuit 40 might operate at about 0.6 to 3 GHz. Typically the reference clock and the internal clock are related by an integer multiple. For example, the internal clock might run at ¼ of the frequency of the reference clock, might run at 2 times the reference clock frequency, might run at 10 times the reference clock frequency, etc. The internal clock signals are provided from the output of clock generation circuit 40 to internal clock path 42.

The internal clock is typically a four-phase signal. The four phases of the internal clock are referred to as CLK0, CLK90, CLK180, and CLK270. Clock CLK0 can be considered to be the primary clock signal. Signal CLK90 is 90° out of phase with CLK0. Clock signal CLK180 is 180° out of phase with respect to CLK0. The fourth phase of the internal clock—CLK 270—is 270° out of phase with respect to CLK0. Because of these phase relationships, the signals CLK0 and CLK180 are inverses of each other and form a complementary pair. Similarly, clock CLK90 is the inverse of clock CLK270. As shown schematically by internal clock distribution path 43, the four-phase internal clock signals may be distributed to circuitry on integrated circuit 10 such as programmable logic 18 (FIG. 1) and other core logic 24 (FIG. 2).

The internal clock is provided to two-phase-serializer master clock generator 44. Two-phase serializer master clock generator 44 generates a two-phase master clock for each serializer 28. Because the two-phase master clock generated by master clock generator 44 is distributed globally on the integrated circuit 10 to serializers in multiple channels, master clock generator 44 is sometimes referred to as a two-phase global serializer master clock generator and the two-phase master clock generated by generator 44 is sometimes referred to as a two-phase global serializer master clock.

The first phase of the two-phase global serializer master clock is called CPULSE_E. The second phase of the two-phase global serializer master clock is called CPULSE_O. As shown in FIG. 2, the global serializer master clock CPULSE_E/CPULSE_O is distributed globally to the global master clock inputs (MSTR) of serializers 28 using master clock global distribution path 46. The internal clock inputs (INT) of each serializer are provided with signals CLK and CLKB over clock path 48. Signals CLK and CLKB are associated with the signals CLK0 and CLK180, respectively, and form a complementary pair.

Each serializer uses its received two-phase global serializer master clock and internal clock signals CLK and CLKB to generate a pair of synchronized internal master serializer clock signals. These master serializer clock signals are used by the serializer in each channel to generate a set of derived serializer clocks. The derived clocks are used internally in each channel's serializer to control the order in which the parallel data from that channel's serializer parallel inputs is placed in the outgoing serial data stream from that channel's serializer. The derived serializer clocks are generated locally, using circuitry in each serializer 28.

To maximize timing margins for the serializers 28, each serializer internally uses a dual-bank architecture. With this arrangement, the parallel input signals to the serializer are divided into odd and even banks of registers. In the example of FIG. 2, each serializer 28 is a 10:1 serializer, so each bank has 5 associated parallel data inputs and five associated registers. The odd and even banks of registers are used in respective odd and even 5:1 serializers. The parallel data signals in the odd bank are converted to serial data using the odd 5:1 serializer. The parallel data signals in the even bank are converted into serial data using the even 5:1 serializer. A two-input serializer is used to merge the outputs of the odd and even 5:1 multiplexers.

In each 10:1 serializer 28, the global serializer master clock signal CPULSE_E is used to produce a local synchronized serializer master clock signal for the even 5:1 serializer in that 10:1 serializer. Synchronous delay circuitry in the even 5:1 serializer generates a set of five derived serializer clock signals from the local version of the master clock CPULSE_E. The clock signal CLK is used to synchronize parallel data as it is being processed by the even 5:1 serializer.

The serializer master clock signal CPULSE_O provided to each 10:1 serializer 28 is used to generate a local synchronized serializer master clock signal for the odd 5:1 serializer in that 10:1 serializer. Synchronous delay circuitry in the odd 5:1 serializer generates a set of five derived serializer clock signals from the local version CPULSE_O. The clock signal CLKB, which is the inverse of the signal CLK, is used to synchronize parallel data as it is being processed by the odd 5:1 serializer.

Figure 3:
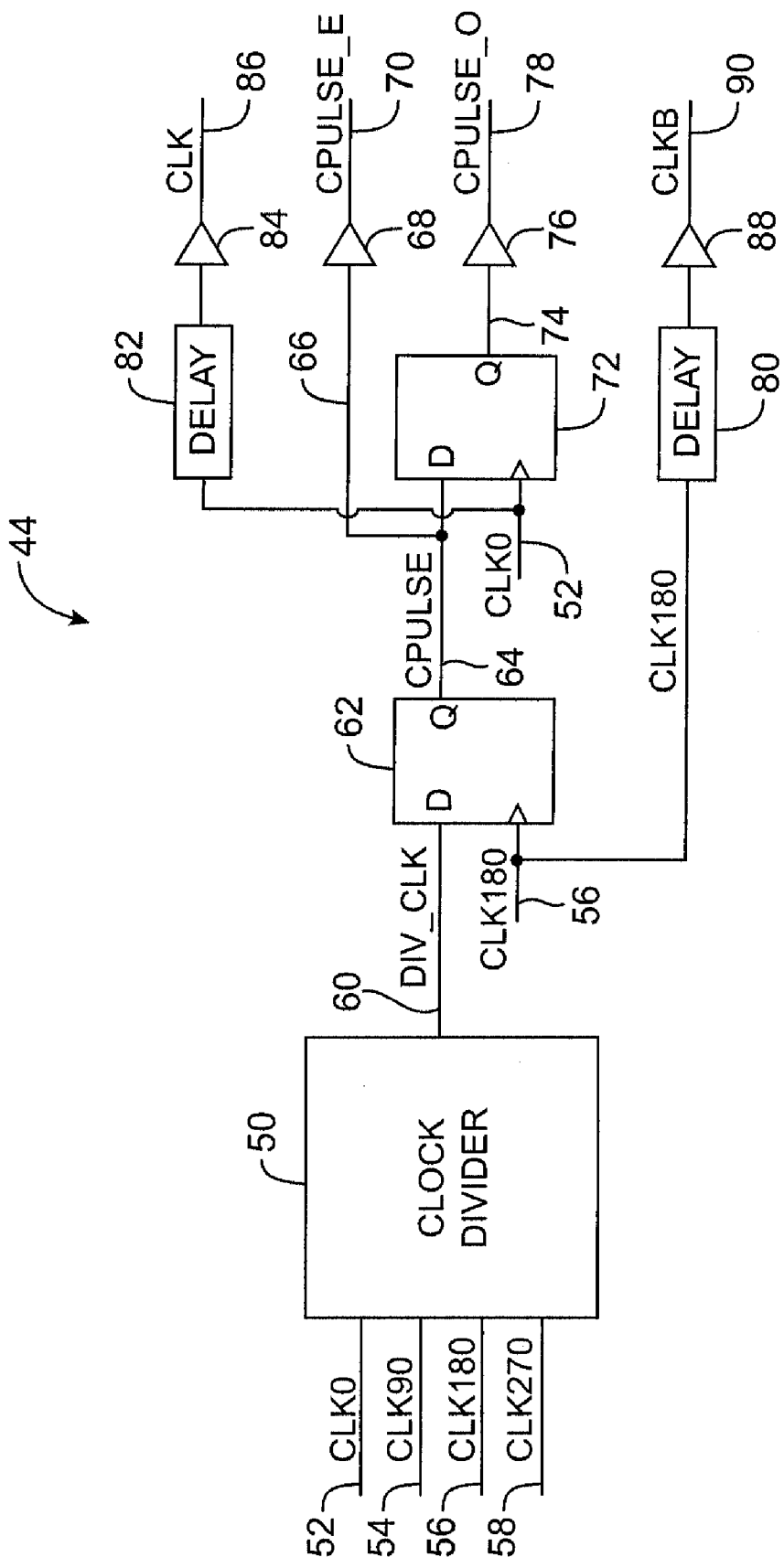
FIG. 3 is a circuit diagram of an illustrative two-phase global serializer master clock generator in accordance with the present invention.

The two-phase global serializer master clock generator 44 of FIG. 2 may be implemented using any suitable circuitry. An illustrative two-phase global serializer master clock generator 44 is shown in FIG. 3. As shown in FIG. 3, two-phase global serializer master clock generator 44 has a clock divider 50 that receives the four phases of the four-phase internal clock at inputs 52, 54, 56, and 58. The clock signal CLK0 is provided to input 52. The clock signal CLK90 is provided to input 54. Inputs 56 and 58 receive the clock signals CLK180 and CLK270, respectively. The clock divider 50 divides the frequency of the internal clock by a suitable integer to produce a corresponding divided clock signal DIV_CLK on line 60. For example, the clock divider 50 divides the internal clock by a factor of 5 when 5:1 even and odd serializers are used in the serializers 28 of FIG. 2.

Registers 62 and 72 (D-Q flip-flops in this example) are used to synchronize the signals on their data (D) inputs to the signals on their clock inputs. Register 62 is used to synchronize the divided clock signal DIV_CLK to the internal clock CLK180 that is provided on input 56. The resulting synchronized version of the divided clock signal DIV_CLK is called CPULSE. The signal CPULSE is provided to buffer 68 via path 64 and path 66. The strengthened version of signal CPULSE, which is called CPULSE_E, is provided at output 70 and serves as one of the two phases of the two-phase serializer master clock.

As shown in FIG. 3, the signal CPULSE is also provided to the data input of register 72 via path 64. Register 72 is clocked using the CLK0 signal, rather than the CLK180 signal that is used to clock register 62. Clock signal CLK0 is 180° out of phase with respect to CLK180, so CLK0 is the inverse of CLK180.

The output of register 72 is provided to buffer 76 using path 74. The output of buffer 76, which is called CPULSE_O, is provided at output 78 and serves as the second of the two phases of the two-phase serializer master clock. Because the register 72 synchronizes the signal CPULSE to an internal clock signal that is shifted by one half of an internal clock cycle with respect to the internal clock used to synchronize CPULSE in register 62, the output CPULSE_O is likewise shifted by a half of an internal clock cycle with respect to CPULSE. As a result, the output CPULSE_O is shifted by a half of an internal clock cycle with respect to CPULSE_E.

Each serializer uses the two-phase global serializer master clock CPULSE_E/CPULSE_O to generate a local two-phase serializer master clock (i.e., a locally synchronized version of the global clock). Outputs 70 and 78 are connected to global distribution path 46 (FIG. 2) and are used to distribute the two-phase global serializer master clock to the serializer 28 in each channel. Local synchronization operations are performed on the two-phase global serializer master clock using the modified internal clocks CLK and CLKB. To ensure a proper timing relationship between the internal clock signals CLK and CLKB and the global serializer master clock, two-phase global serializer master clock generator 44 uses delay elements 80 and 82. Delay element 82 compensates for the clock-to-output delay of register 72. Delay element 80 compensates for the clock-to-output delay of register 62.

The output of delay element 82 is connected to buffer 84. The output of delay element 80 is connected to buffer 88. Signals CLK and CLKB, which represent compensated versions of CLK0 and CLK180, are provided to the internal clock inputs of serializers 28 (labeled INT in FIG. 2) via outputs 86 and 90 and internal clock distribution path 48 (FIG. 2).

Figure 4:
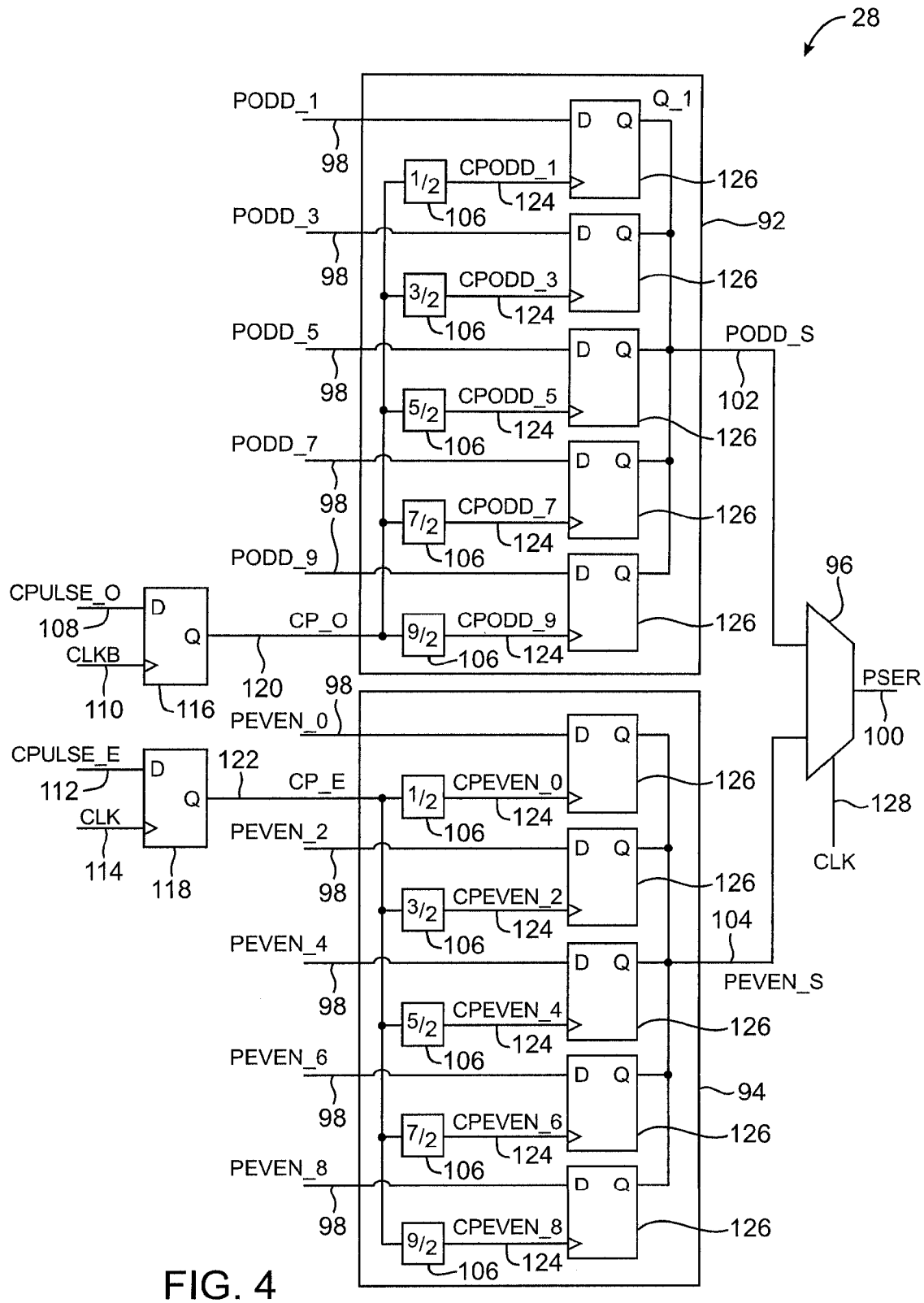
FIG. 4 is a circuit diagram of an illustrative 10:1 serializer that may be clocked using a two-phase global serializer master clock generated by a two-phase global serializer master clock generator of the type shown in FIG. 3 in accordance with the present invention.

An illustrative serializer 28 is shown in FIG. 4. In the example of FIG. 4, serializer 28 is a 10:1 serializer. Serializer 28 contains two 5:1 serializers (serializers 92 and 94) and a 2:1 serializer (serializer 96). Parallel data from core logic 24 is received at inputs 98. Following parallel-to-serial data conversion, corresponding serial data PSER is provided at serializer output 100.

Serializer 28 has ten parallel data inputs and one corresponding serial data output. The ten parallel serial data inputs are organized in two banks, called "odd" and "even". The parallel signals in the odd bank are labeled PODD_1, PODD_3, PODD_5, PODD_7, and PODD_9. The odd bank parallel data input signals are provided to the five parallel data inputs of the odd-bank 5:1 serializer 92. The parallel signals in the even bank are labeled PEVEN_0, PEVEN_2, PEVEN_4, PEVEN_6, and PEVEN_8. The even bank parallel data input signals are provided to the five parallel data inputs of the even-bank 5:1 serializer 94.

The odd serializer 92 converts the parallel data PODD_1, PODD_3, PODD_5, PODD_7, and PODD_9 into serial data PODD_S at its output 102. Even serializer 94 converts the parallel data PEVEN_0, PEVEN_2, PEVEN_4, PEVEN_6, and PEVEN_8 into serial data PEVEN_S at its output 104. The PODD_S and PEVEN_S signals are provided in parallel to the two inputs of serializer 96. Serializer 96, which is clocked using the CLK clock signal, merges parallel data signals PODD_S and PEVEN_S to produce serial data signal PSER on output 100.

The global serializer master clock signals CPULSE_O and CPULSE_E that were produced at the outputs 78 and 70 of two-phase serializer master clock generator 44 in FIG. 2 are received over path 46 (FIG. 2) at global serializer master clock inputs 108 and 112. The odd-phase serializer master clock signal CPULSE_O is used in deriving a series of five related clock pulses CPODD_1, CPODD_3, CPODD_5, CPODD_7, and CPODD_9, which are used to clock respective registers 126 in the serializer 92. The even-phase serializer master clock signal CPULSE_E is used in deriving a series of five related clock pulses CPEVEN_0, CPEVEN_2, CPEVEN_4, CPEVEN_6, and CPEVEN_8, which are used to clock respective registers 126 in the serializer 94.

Figure 5:
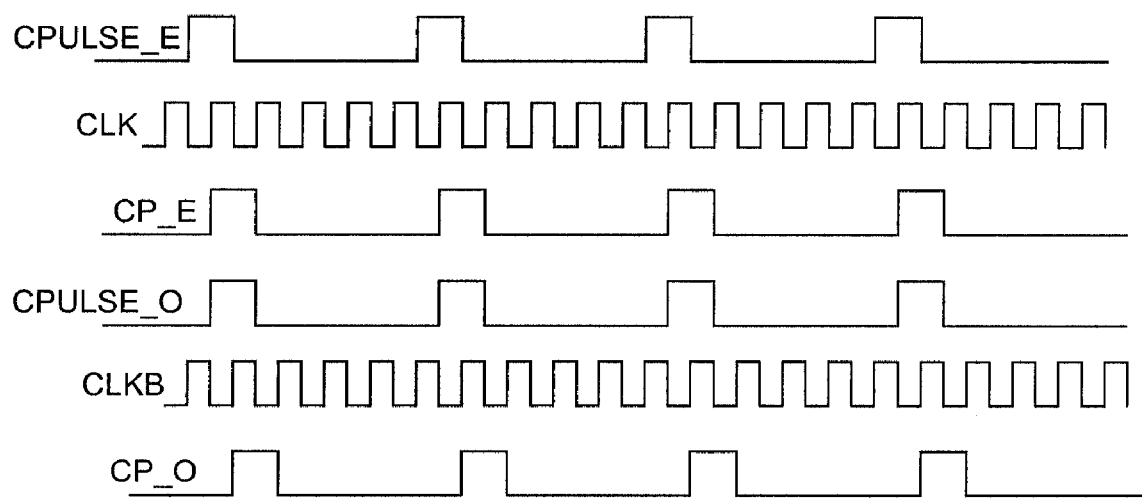
FIG. 5 is a timing diagram showing the relationship between clock signals in an integrated circuit with a two-phase serializer master clock in accordance with the present invention.

Before the global serializer master clock signals are used internally in serializer 48, they are locally synchronized using the signals CLK and CLKB, as shown in FIG. 5. Signals CLK and CLKB are routed to serializer 28 over path 48 (FIG. 2) and are received at inputs 114 and 110. The odd-phase serializer master clock signal CPULSE_O is synchronized to internal clock signal CLKB by register 116 to produce synchronized odd-phase serializer master clock signal CP_O. The even-phase serializer master clock signal CPULSE_E is synchronized to internal clock signal CLK by register 118 to produce synchronized even-phase serializer master clock signal CP_E.

As shown in FIG. 4, the signal CP_O is distributed by path 120 to synchronous delay circuitry that derives the set of five associated serializer clock signals CPODD_1, CPODD_3, CPODD_5, CPODD_7, and CPODD_9 on lines 124. As represented schematically by synchronous delay elements 106, this circuitry delays the odd-phase serializer master clock signal CP_O by five different amounts. The delay element 106 in serializer 92 that is labeled "½" delays the signal CP_O by one half of an internal clock cycle to produce signal CPODD_1. The delay element 106 in serializer 92 that is labeled "³/₂" delays CP_O by one and a half internal clock cycles to produce signal CPODD_3. The delay elements labeled "⁵/₂", "⁷/₂", and "⁹/₂" delay CP_O by two and a half, three and a half, and four and a half cycles to produce signals CPODD_5, CPODD_7, and CPODD_9, respectively.

The synchronous delay circuitry in serializer 94 operates similarly. The signal CP_E is distributed by path 122 to synchronous delay circuitry that derives the set of five associated serializer clock signals CPEVEN_0, CPEVEN_2, CPEVEN_4, CPEVEN_6, and CPEVEN_8 on lines 124. Synchronous delay elements 106 are used to delay the even-phase serializer master clock signal CP_E by five different amounts. The "½" delay element 106 in serializer 94 delays the signal CP_E by one half of an internal clock cycle to produce signal CPEVEN_0. The delay elements in serializer 94 that are labeled "³/₂", "⁵/₂", "⁷/₂", and "⁹/₂" delay CP_E by one and a half, two and a half, three and a half, and four and a half cycles to produce signals CPEVEN_2, CPEVEN_4, CPEVEN_6, and CPEVEN_8, respectively.

Figure 6:
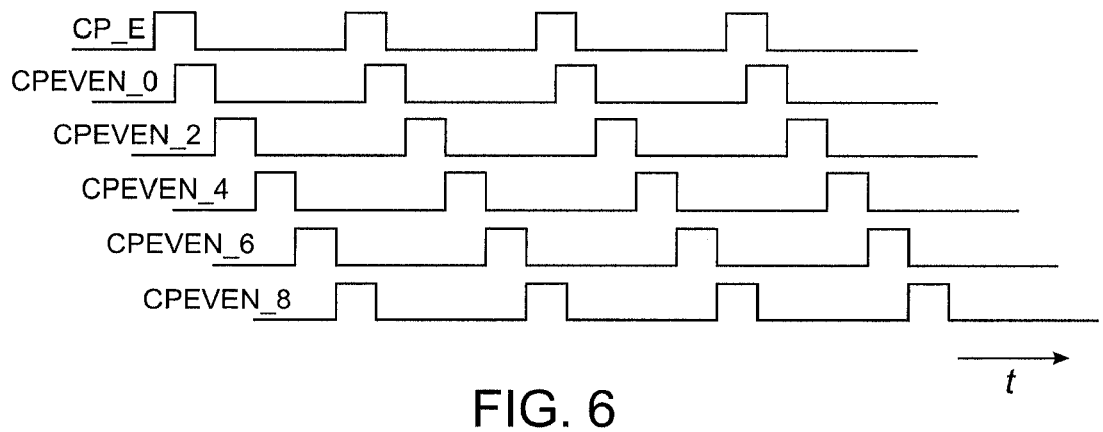
FIGS. 6 and 7 are timing diagrams showing how multiple serializer clocks may be derived from the two phases of a serializer master clock obtained using a two-phase global serializer master clock of the type shown in FIG. 3 in accordance with the present invention.
Figure 7:
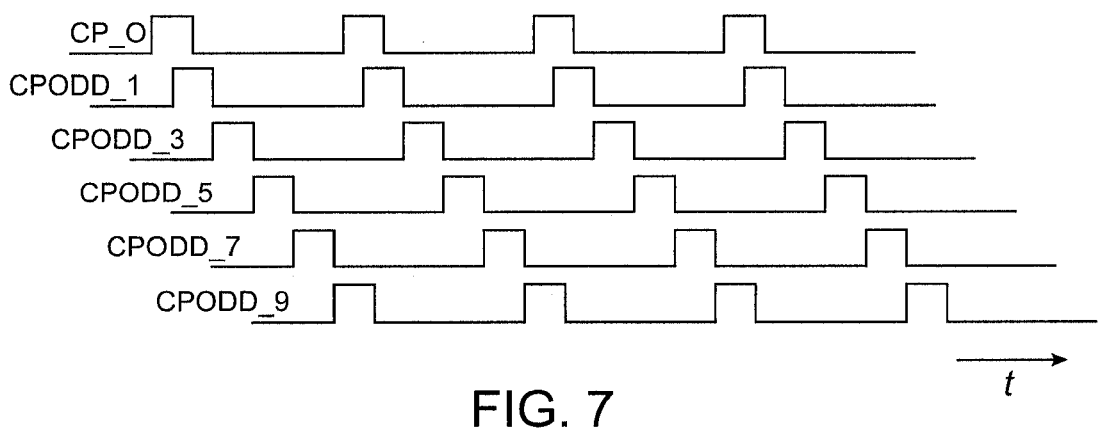

As shown in FIG. 6, the signals CPEVEN_0, CPEVEN_2, CPEVEN_4, CPEVEN_6, and CPEVEN_8 that are derived from CP_E are each shifted in time by a different amount by the synchronous delay circuitry. CP_E is used as a master clock in deriving the signals CPEVEN_0, CPEVEN_2, CPEVEN_4, CPEVEN_6, and CPEVEN_8, so signal CP_E is sometimes referred to as a serializer master clock. As shown in FIG. 7, the signals CPODD_1, CPODD_3, CPODD_5, CPODD_7, and CPODD_9 are derived from CP_O in the same way.

The serializer clock pulse signals CPEVEN_0, CPEVEN_2, CPEVEN_4, CPEVEN_6, CPEVEN_8, CPODD_1, CPODD_3, CPODD_5, CPODD_7, and CPODD_9 are provided to the clock inputs of the odd and even banks of serializer registers 126. As each of these clock pulses go high, the output of its associated register 126 becomes valid. This operation captures a time-slice of the data at each register's input.

Figure 8:
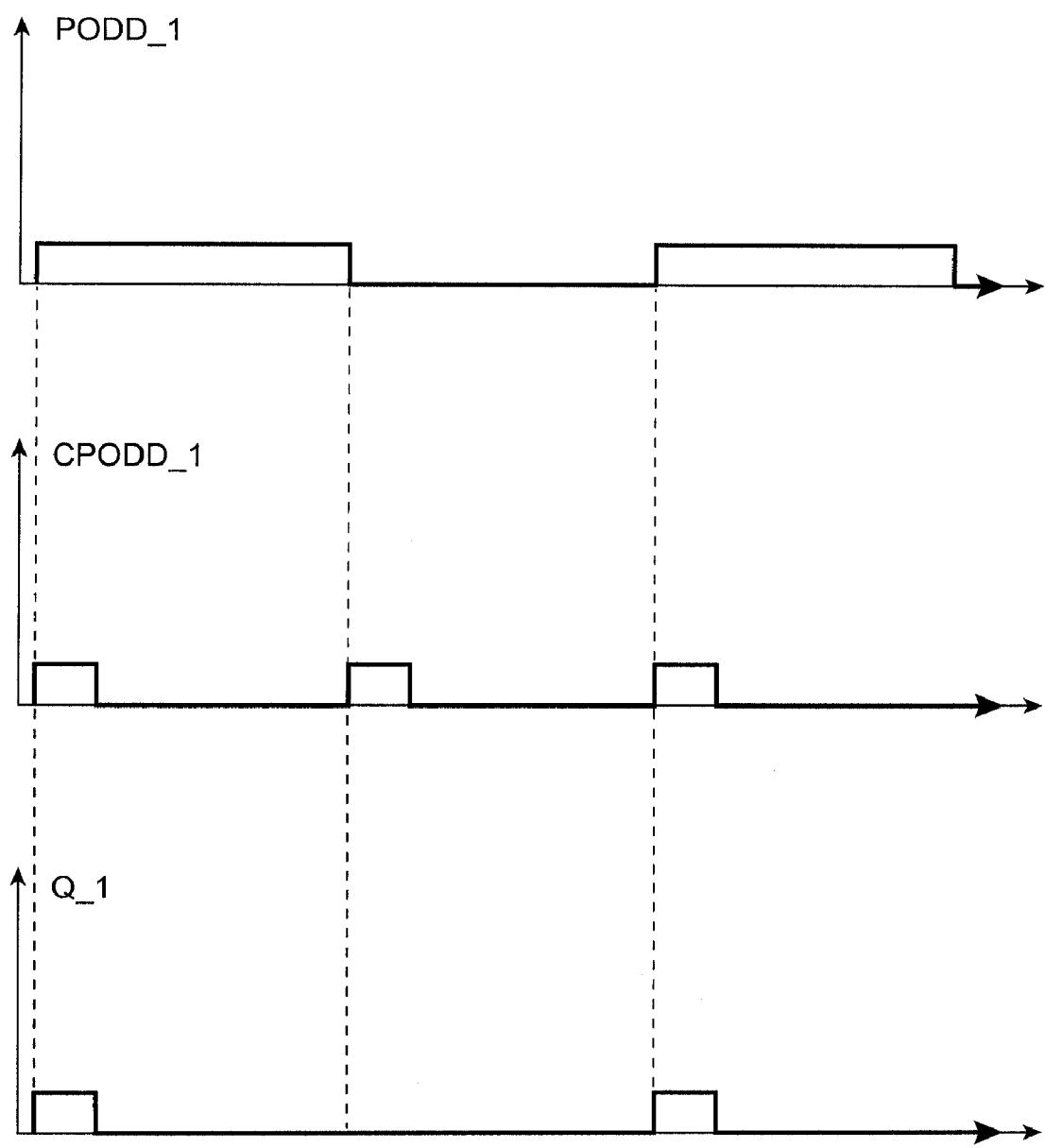
FIG. 8 is a timing diagram showing how parallel data is converted to serial data in a serializer when the parallel data is clocked using clock signals derived from a serializer master clock in accordance with the present invention.

The capture operation is illustrated in FIG. 8. The first (uppermost) trace in FIG. 8 provides an example of a data stream PODD_1 that may be presented to the data input of the first register 126 in serializer 92. The second trace in FIG. 8 shows the clock pulse CPODD_1. As shown, the signal CPODD_1 has a frequency that is one fifth of the frequency of data signal PODD_1, because serializer 92 is a 5:1 serializer. Each time the signal CPODD_1 goes high, the output of the first register 126 in serializer 92 is captured and passed to its output, as shown by the third trace in FIG. 8 (labeled Q_1 to indicate that the output of the uppermost register 126 in serializer 92 is being depicted). Each of the other registers 126 is clocked using an appropriate locally-derived serializer clock pulse and captures slices of parallel input data signals in the same way. The slices of captured parallel data are provided as serial data PODD_S and PEVEN_S on lines 102 and 104.

Because CP_E and CP_O are shifted by half of an internal clock cycle with respect to each other, the signals PODD_S and PEVEN_S can be merged. Multiplexer 96 receives inputs PODD_S and PEVEN_S from paths 102 and 104 and merges these signals onto serial output line 100. Multiplexer 96 performs this 2:1 parallel-to-serial conversion operation based on the internal clock signal CLK that is provided to clock input 128.

Conventional serializer architectures use single-phase global serializer master clock generators. This type of architecture tends to impose severe timing constraints on the serializers and therefore poses challenges for reliable operation.

Figure 9:
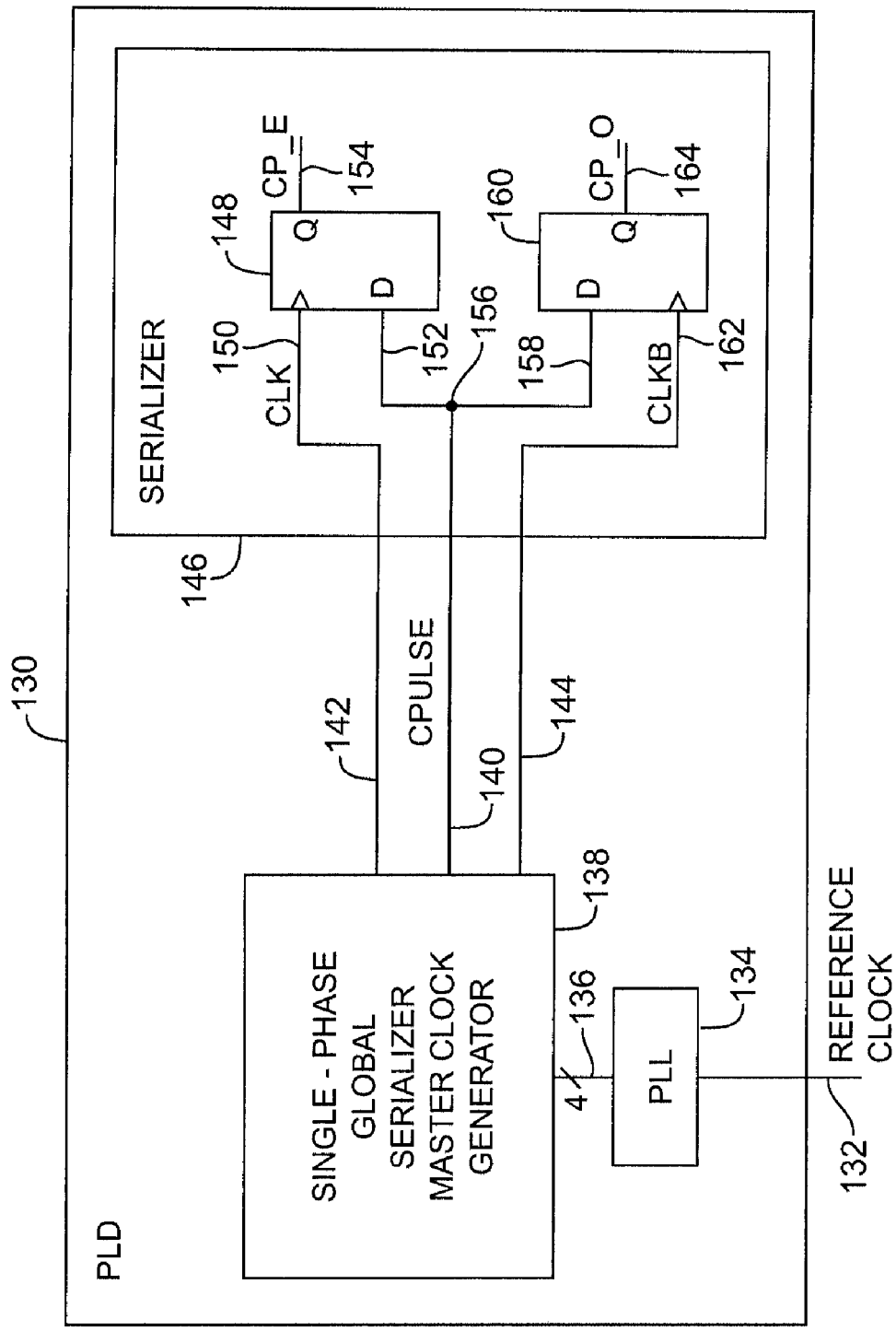
FIG. 9 is a diagram of a conventional single-phase global serializer master clock generator that is providing a single global serializer master clock signal to a serializer in accordance with the present invention.

A conventional serializer arrangement that is based on a single-phase global serializer master clock generator is shown in FIG. 9. As shown in FIG. 9, conventional programmable logic device 130 receives a reference clock signal at an input pin 132. The reference clock signal is processed by a phase-locked-loop clock generation circuit 134. Clock generation circuit 134 produces a four-phase internal clock based on the reference clock on path 136. The four-phase internal clock on path 136 is provided to single-phase global serializer master clock generator 138.

Single-phase global serializer master clock generator 138 uses the four-phase internal clock that is provided over path 136 to generate a single-phase global serializer master clock CPULSE. The CPULSE signal is distributed globally to multiple serializers such as serializer 146 over single-phase global serializer master clock distribution paths such as path 140. Single-phase global serializer master clock generator also uses the four-phase internal clock to generate two complementary internal clock signals CLK and CLKB at the same frequency as the internal clock received over path 136. The CLK and CLKB signals are distributed to serializers such as serializer 146 over respective paths such as paths 142 and 144.

At each serializer 146, the single phase global serializer master clock CPULSE is locally split and routed to the data inputs D of two different registers. Node 156 receives CPULSE from line 140. The CPULSE signal is distributed to the data input of register 148 from node 156 using path 152 and is distributed to the data input of register 160 from node 156 using path 158. Register 148 receives the CLK signal at its clock input via path 150. Path 162 is used to route the clock signal CLKB to the clock input of register 160.

Registers 148 and 160 use the CLK and CLKB signals to process the CPULSE signal within serializer 146. The signals CLK and CLKB are complementary (180° out-of-phase), so registers 148 and 160 produce a respective pair of serializer master clock signals CP_E and CP_O at outputs 154 and 164 that are shifted in time with respect to each other by half of a CLK clock cycle. The CP_E and CP_O signals at outputs 154 and 164 may be applied to the CP_E and CP_O inputs of serializers such as 5:1 serializers 94 and 92 of FIG. 4. This ensures that the output signals from the 5:1 serializers will have the appropriate timing to allow downstream merging by 2:1 multiplexer 96.

Figure 10:
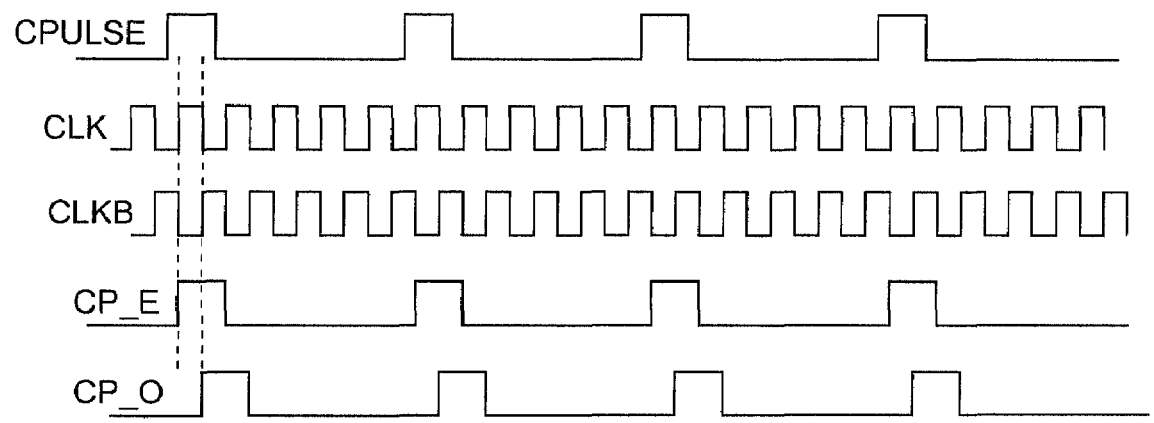
FIG. 10 is a timing diagram showing how the conventional serializer circuitry of FIG. 9 is used to internally generate two synchronized serializer master clock signals from a single global serializer master clock.

FIG. 10 shows the timing relationships between the single-phase global master serializer clock CPULSE and the other clock signals in the conventional arrangement of FIG. 9. As shown in FIG. 10, the single-phase global master serializer clock CPULSE has a pulse rate that is an integer multiple of the internal clocks CLK and CLKB. The ratio of the clock frequency of CLK and CLKB in relation to the pulse rate for CPULSE is dictated by the number of parallel inputs being handled by the serializer. In the situation depicted in FIG. 10, there is one CPULSE pulse for every five CLK periods, as needed for a 10:1 serializer made up of two parallel 5:1 serializers and a 2:1 serializer.

Registers 148 and 160 of FIG. 9 are edge-triggered flip flops. When the signal CLK goes high, the CP_E signal at output 154 goes high, provided that the signal CPULSE is high at data input 152. As shown in FIG. 10, this ensures that the CP_E signal is aligned with the leading edge of CLK. Similarly, when the signal CLKB goes high, the CP_O signal at output 164 is taken high, provided that the signal CPULSE is high at data input 158. This ensures that the leading edges of the CLKB signal and the CP_O signal are aligned. Once the synchronized serializer master clock signals CP_O and CP_E have been generated, these signals can be used within the serializer to derive the signals for the serializer's internal banks of registers (such as registers 126 in FIG. 4).

Figure 11:
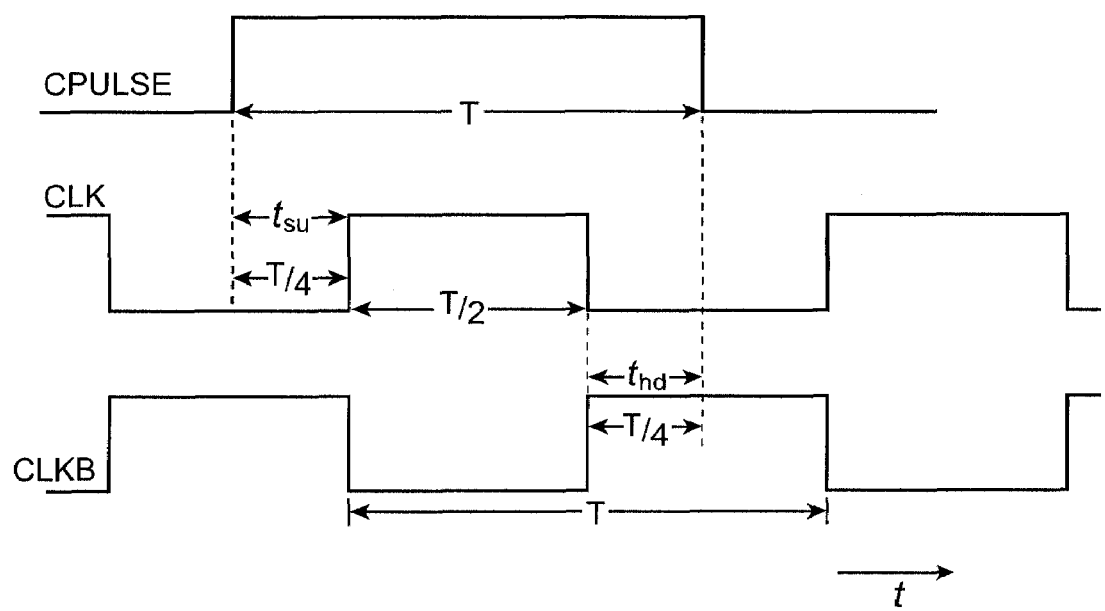
FIG. 11 is a timing diagram showing the set-up time and hold time associated with generating the two synchronized serializer master clock signals using the conventional serializer architecture of FIG. 9.

Although it may be satisfactory to generate CP_E and CP_O from the single-phase serializer master clock CPULSE in certain circumstances, the timing margins associated with generating the CP_E and CP_O signals in this way may not always be sufficient at high clock frequencies. The timing margins associated with generating the signals CP_E and CP_O from CPULSE are shown in FIG. 11. As shown in FIG. 11, there is a setup time $t_{su}$ associated with generating CP_E from CPULSE and a hold time $t_{hd}$ associated with generating CP_O from CPULSE. The setup time $t_{su}$ is the amount of time that the CPULSE signal must be valid (high) at the data input 152 of register 148 before CLK is allowed to go high at the clock input 150 of register 148. The hold time $t_{hd}$ is the amount of time that the CPULSE signal must be valid at the data input 158 of register 160 after the signal CLKB goes high at the clock input 162.

The length of the CPULSE pulses is equal to the period T of clock signals CLK and CLKB. Each CPULSE pulse therefore remains high for twice as long as each CLK (and CLKB) signal. Because CLK and CLKB are 180° out of phase, any increase in $t_{su}$ will result in a decrease in $t_{hd}$. This limits the maximum timing margins for conventional architectures of the type shown in FIG. 9. As shown in FIG. 11, maximum timing margins are obtained by placing the CLK pulse at the midpoint of the CPULSE signal. With this arrangement, the maximum setup times $t_{su}$ and hold times $t_{hd}$ that may be achieved is T/4. Any attempt to increase $t_{su}$ beyond T/4 will result in a reduction in $t_{hd}$. Similarly, $t_{hd}$ cannot be increased above T/4 without reducing $t_{su}$ below T/4 by an equal amount.

Clock signals CPULSE, CLK, and CLKB exhibit skew and jitter. Clock signal skew results from differences between the propagation delays associated with each of the different signal paths 140, 142, and 144 on programmable logic device 130 (FIG. 9) and is affected by so-called PVT variations (variations in process, voltage, and temperature). Because skew is unavoidable, the actual setup time and hold time timing margins in conventional arrangements of the type described in connection with FIG. 11 are equal to T/4−skew (i.e., $t_{su}$=T/4−$t_{skew}$ and $t_{hd}$=T/4−$t_{skew}$). At a high data rate such as 13.5 Gbps (6.5 Ghz), the clock period T is only 154 ps. In this type of environment, $t_{su}$ and $t_{hd}$ are limited to 38.5 ps−$t_{skew}$. These timing constraints do not leave a significant margin for error (i.e., to accommodate clock jitter), particularly during multi-channel operation, where clock skew problems are exacerbated.

The two-phase serializer master clock architecture of the present invention exhibits improved timing margins at a given clock speed, because the synchronized serializer master clock signals CP_O and CP_E that are locally generated for the serializer in each channel are generated from a two-phase global serializer master clock (signals CPULSE_O and CPULSE_E), rather than a single-phase global serializer master clock (CPULSE). The improved timing margins resulting from the two-phase global serializer master clock architecture are illustrated in FIG. 12.

Figure 12:
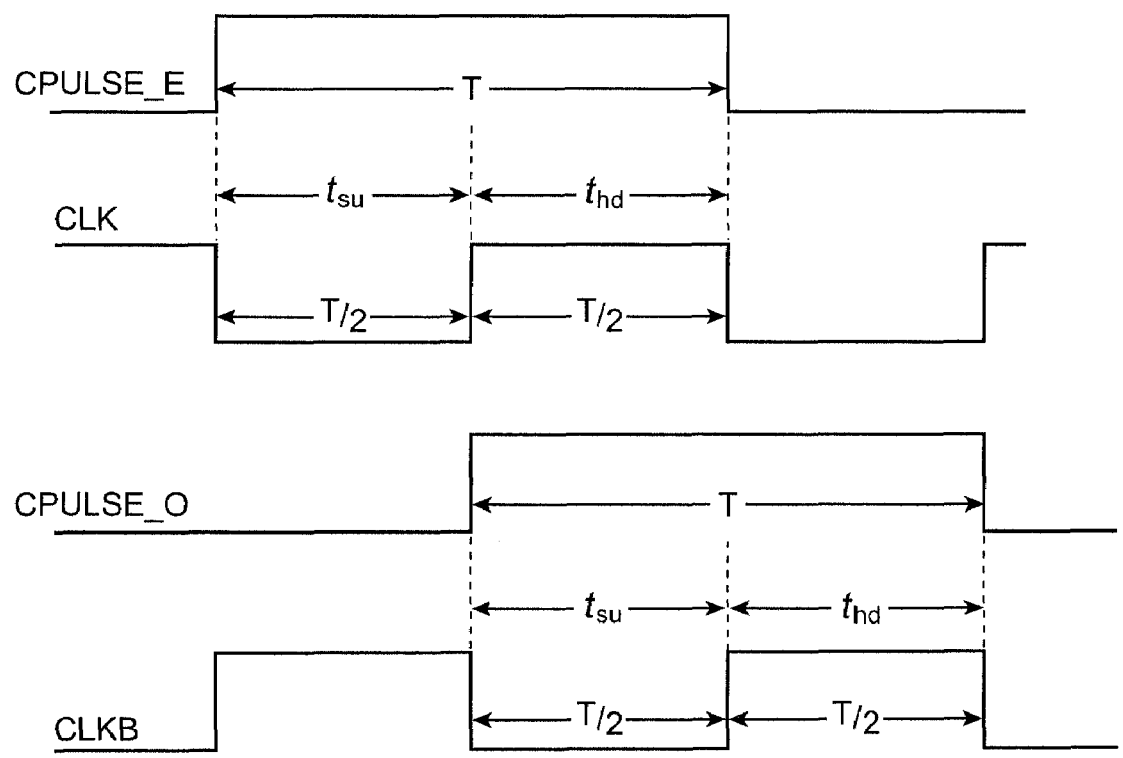
FIG. 12 is timing diagram showing the set-up times and hold times associated with using a serializer to generate two synchronized serializer master clock signals from the two-phase global serializer master clock that is produced by the two-phase global serializer master clock generator of FIG. 3 in accordance with the present invention.

As shown in FIG. 12, the rising edge of the signal CLK is aligned with the center of the CPULSE_E signal, resulting in $t_{su}$ and $t_{hd}$ times of T/2 (minus $t_{skew}$). These setup and hold timing margins apply to register 118 of FIG. 4. Similarly, the leading edge of the CLKB signal is aligned with the midpoint of the CPULSE_O signal, resulting in $t_{su}$ and $t_{hd}$ times of T/2 (minus $t_{skew}$). These setup and hold times are associated with register 116 of FIG. 4. By increasing timing margins by almost a factor of two (e.g., from about T/4 to about T/2), the ability of the serializer to accommodate high data rates is improved significantly over conventional designs.

Figure 13:
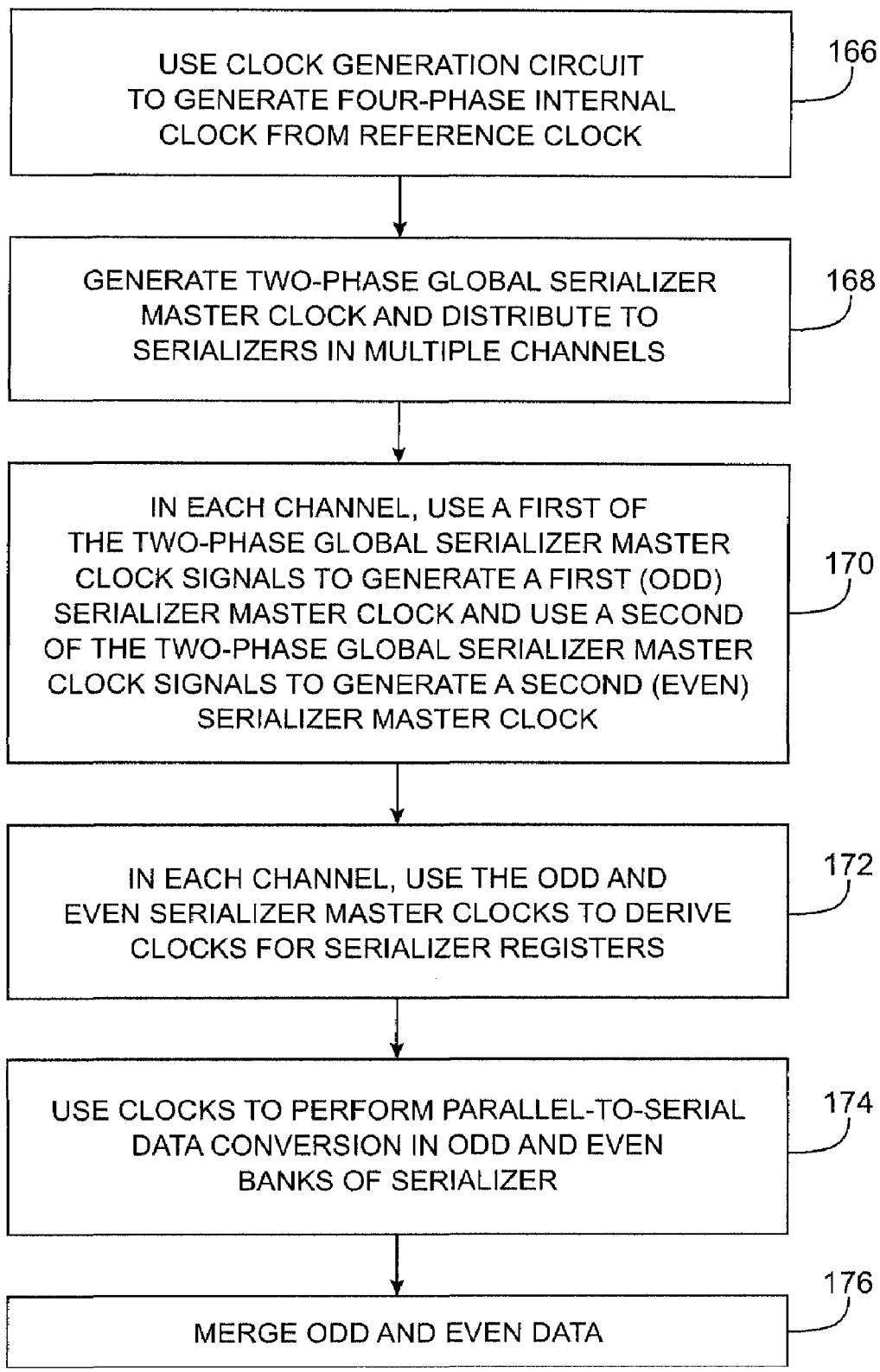
FIG. 13 is a flow chart of illustrative steps involved in using a two-phase global serializer master clock generator architecture in an integrated circuit in accordance with the present invention.

Illustrative steps involved in using the two-phase global serializer master clock generation architecture of the present invention in an integrated circuit are shown in FIG. 13.

At step 166, a clock generation circuit such as the clock generation circuit 40 of FIG. 2 receives a reference clock and generates a corresponding four-phase internal clock. The clock generation circuit may be based on a phase-locked loop (PLL) circuit or a delay-locked loop (DLL) circuit or may use any other suitable clock generation circuitry.

At step 168, a two-phase global serializer master clock generator such as two-phase global serializer master clock generator 44 of FIG. 2 uses the four-phase internal clock to generate a two-phase global serializer master clock (CPULSE_E and CPULSE_O). The two-phase global serializer master clock generator 44 also uses the four-phase internal clock to generate a pair of complementary time-corrected global internal clock signals CLK and CLKB for use in clocking the serializers on the integrated circuit. The two-phase global serializer master clock generator 44 preferably contains delay elements such as delay elements 80 and 82 of FIG. 3 that compensate for the clock-to-output delay associated with synchronizing registers 62 and 72.

During step 168, the global clock signals generated by the two-phase global serializer master clock generator are distributed to multiple serializers over paths such as paths 46 and 48 of FIG. 2. In a typical arrangement, there is a serializer associated with each of multiple serial communications channels.

At step 170, the serializer in each channel uses the two phases of the global serializer master clock CPULSE_E and CPULSE_O to generate two corresponding local synchronized serializer master clock signals CP_E and CP_O (sometimes referred to as odd and even serializer master clock signals). This generation process uses the two complementary global internal clocks (CLK and CLKB), as described in connection with FIGS. 4, 5, and 12.

The serializer in each channel is preferably organized using a two-bank architecture having two serializers (e.g., 5:1 serializers) with corresponding odd and even banks of registers. The registers are used to convert incoming parallel data signals into corresponding serial data signals. During step 172, clock signals for the odd bank registers and the even bank registers are derived from the odd and even serializer master clocks.

At step 174, the register clocks that have been derived from the CP_E and CP_O master clocks are used in the even and odd banks of registers in the serializer in each channel to perform parallel-to-serial data conversion.

At step 176, 2:1 serializers in each channel such as 2:1 serializer 96 of FIG. 4 are used to merge the odd-bank serialized data in that channel with the even-bank serialized data in that channel. The merged odd-bank and even-bank data is provided at the serial output of the serializer in each serial communications channel. The serial output data is then provided to an output buffer in each channel for transmission to another integrated circuit over a high-speed serial data path.

The foregoing is merely illustrative of the principles of this invention and various modifications can be made by those skilled in the art without departing from the scope and spirit of the invention.

What is claimed is:

1. An integrated circuit comprising:
   a clock generation circuit that receives a reference clock and produces a corresponding internal clock;
   a two-phase global serializer master clock generator that receives the internal clock and that generates a two-phase global serializer master clock;
   a plurality of serializers each of which converts parallel data into serial data for a respective serial communications channel; and
   a global distribution path that globally distributes the two-phase global serializer master clock to each of the plurality of serializers on the integrated circuit from the two-phase global serializer master clock generator.

2. The integrated circuit defined in claim 1 wherein the two-phase global serializer master clock generator comprises first and second registers.

3. The integrated circuit defined in claim 1 wherein the two-phase global serializer master clock generator comprises:
   a first register having a data input, a clock input, and an output, wherein the output of the first register is coupled to the distribution path and provides a first of the two phases of the two-phase global serializer master clock; and
   a second register having a data input, a clock input, and an output, wherein the output of the second register is coupled to the distribution path and provides a second of the two phases of the two-phase global serializer master clock.

4. The integrated circuit defined in claim 1 wherein the internal clock generated by the clock generation circuit comprises a four-phase internal clock and wherein the two-phase global serializer master clock generator comprises:
   a clock divider that receives the four-phase internal clock and that produces a corresponding divided clock signal;
   a first register having a data input, a clock input, and an output, wherein the data input of the first register receives the divided clock signal and wherein the output of the first register is coupled to the distribution path and provides a first of the two phases of the two-phase global serializer master clock; and
   a second register having a data input, a clock input, and an output, wherein the output of the second register is coupled to the distribution path and provides a second of the two phases of the two-phase global serializer master clock.

5. The integrated circuit defined in claim 1 wherein the internal clock generated by the clock generation circuit comprises a four-phase internal clock and wherein the two-phase global serializer master clock generator comprises:
   a clock divider that receives the four-phase internal clock and that produces a corresponding divided clock signal;
   a first register having a data input, a clock input, and an output, wherein the clock input of the first register receives a first phase of the four-phase internal clock, wherein the data input of the first register receives the divided clock signal, and wherein the output of the first register is coupled to the distribution path and provides a first of the two phases of the two-phase global serializer master clock; and
   a second register having a data input, a clock input, and an output, wherein the clock input of the second register receives a second phase of the four-phase internal clock and wherein the output of the second register is coupled to the distribution path and provides a second of the two phases of the two-phase global serializer master clock.

6. The integrated circuit defined in claim 1 wherein the internal clock generated by the clock generation circuit comprises a four-phase internal clock and wherein the two-phase global serializer master clock generator comprises:
   a clock divider that receives the four-phase internal clock and that produces a corresponding divided clock signal;
   a first register having a data input, a clock input, and an output, wherein the clock input of the first register receives a first phase of the four-phase internal clock, wherein the data input of the first register receives the divided clock signal, and wherein the output of the first register is coupled to the distribution path and provides a first of the two phases of the two-phase global serializer master clock; and
   a second register having a data input, a clock input, and an output, wherein the clock input of the second register receives a second phase of the four-phase internal clock that is inverted with respect to the first phase of the of the four-phase internal clock and wherein the output of the second register is coupled to the distribution path and provides a second of the two phases of the two-phase global serializer master clock.

7. The integrated circuit defined in claim 1 wherein the internal clock generated by the clock generation circuit comprises a four-phase internal clock and wherein the two-phase global serializer master clock generator comprises:
   a clock divider that receives the four-phase internal clock and that produces a corresponding divided clock signal;
   a first register having a data input, a clock input, and an output, wherein the clock input of the first register receives a first phase of the four-phase internal clock, wherein the data input of the first register receives the divided clock signal, and wherein the output of the first register is coupled to the distribution path and provides a first of the two phases of the two-phase global serializer master clock;
   a second register having a data input, a clock input, and an output, wherein the clock input of the second register receives a second phase of the four-phase internal clock that is inverted with respect to the first phase of the of the four-phase internal clock, wherein the output of the second register is coupled to the distribution path and provides a second of the two phases of the two-phase global serializer master clock; and
   first and second delay elements coupled to corresponding first and second internal clock outputs, wherein the first delay element receives the first phase of the four-phase internal clock and compensates for a clock-to-output delay associated with the first register and wherein the second delay element receives the second phase of the four-phase internal clock and compensates for a clock-to-output delay associated with the second register.

8. The integrated circuit defined in claim 1 wherein the serializer associated with each serial communications channel comprises:
   a first serializer that converts a first half of the parallel data to serial data;
   a second serializer that converts a second half of the parallel data to serial data; and
   a 2:1 serializer that receives the serial data from the first serializer and the serial data from the second serializer and that merges the serial data from the first serializer and the serial data from the second serializer to produce the serial data for the serial communications channel.

9. The integrated circuit defined in claim 1 wherein the serializer associated with each serial communications channel comprises:
   a first serializer that converts a first half of the parallel data to serial data;
   a second serializer that converts a second half of the parallel data to serial data;
   a 2:1 serializer that receives the serial data from the first serializer and the serial data from the second serializer and that merges the serial data from the first serializer and the serial data from the second serializer to produce the serial data for the serial communications channel;
   a first register that receives a first of the two phases of the two-phase global serializer master clock;
   a second register that receives a second of the two phases of the two-phase global serializer master clock, wherein the first register has an output that provides a first serializer master clock to the first serializer and wherein the second register has an output that provides a second serializer master clock to the second serializer.

10. The integrated circuit defined in claim 1 wherein the serializer associated with each serial communications channel comprises:
    a first serializer that converts a first half of the parallel data to serial data;
    a second serializer that converts a second half of the parallel data to serial data;
    a 2:1 serializer that receives the serial data from the first serializer and the serial data from the second serializer and that merges the serial data from the first serializer and the serial data from the second serializer to produce the serial data for the serial communications channel;
    a first register having a clock input, a data input, and an output, wherein the data input of the first register receives a first phase of the two-phase global serializer master clock, wherein the clock input of the first register receives a first phase of the internal clock, and wherein the output of the first register provides a first serializer master clock to the first serializer; and
    a second register having a clock input, a data input, and an output, wherein the data input of the second register receives a second phase of the two-phase global serializer master clock, and wherein the clock input of the second register receives a second phase of the internal clock, and wherein the output of the second register provides a second serializer master clock to the second serializer.

11. The integrated circuit defined in claim 1 wherein the serializer associated with each serial communications channel comprises:
    a first serializer that converts a first half of the parallel data to serial data, wherein the first serializer has a plurality of registers each of which receives a respective input signal in the first half of the parallel data and each of which has a clock input;
    a second serializer that converts a second half of the parallel data to serial data, wherein the second serializer has a plurality of registers each of which receives a respective input signal in the second half of the parallel data and each of which has a clock input;
    a 2:1 serializer that receives the serial data from the first serializer and the serial data from the second serializer and that merges the serial data from the first serializer and the serial data from the second serializer to produce the serial data for the serial communications channel;

a first register having a clock input, a data input, and an output, wherein the data input of the first register receives a first phase of the two-phase global serializer master clock, wherein the clock input of the first register receives a first phase of the internal clock, and wherein the output of the first register provides a first serializer master clock to the first serializer;

a second register having a clock input, a data input, and an output, wherein the data input of the second register receives a second phase of the two-phase global serializer master clock, and wherein the clock input of the second register receives a second phase of the internal clock, and wherein the output of the second register provides a second serializer master clock to the second serializer;

synchronous delay circuitry in the first serializer that receives the first serializer master clock and that derives a plurality of corresponding clocks that are applied respectively to the clock inputs of the registers in the first serializer; and synchronous delay circuitry in the second serializer that receives the second serializer master clock and that derives a plurality of corresponding clocks that are applied respectively to the clock inputs of the registers in the second serializer.

12. The integrated circuit defined in claim 1 wherein the serializer associated with each serial communications channel comprises:

a first serializer that converts a first half of the parallel data to serial data, wherein the first serializer has a plurality of registers each of which receives a respective input signal in the first half of the parallel data and each of which has a clock input and wherein the plurality of registers have outputs;

a second serializer that converts a second half of the parallel data to serial data, wherein the second serializer has a plurality of registers each of which receives a respective input signal in the second half of the parallel data and each of which has a clock input and wherein the plurality of registers have outputs;

a 2:1 serializer that receives the serial data from the register outputs of the first serializer and the serial data from the register outputs of the second serializer and that merges the serial data from the first serializer and the serial data from the second serializer to produce the serial data for the serial communications channel;

a first register having a clock input, a data input, and an output, wherein the data input of the first register receives a first phase of the two-phase global serializer master clock, wherein the clock input of the first register receives a first phase of the internal clock, and wherein the output of the first register provides a first serializer master clock to the first serializer;

a second register having a clock input, a data input, and an output, wherein the data input of the second register receives a second phase of the two-phase global serializer master clock, and wherein the clock input of the second register receives a second phase of the internal clock, and wherein the output of the second register provides a second serializer master clock to the second serializer;

synchronous delay circuitry in the first serializer that receives the first serializer master clock and that derives a plurality of corresponding clocks that are applied respectively to the clock inputs of the registers in the first serializer; and synchronous delay circuitry in the second serializer that receives the second serializer master clock and that derives a plurality of corresponding clocks that are applied respectively to the clock inputs of the registers in the second serializer.

13. The integrated circuit defined in claim 1 wherein the internal clock generated by the clock generation circuit comprises a four-phase internal clock and wherein the two-phase global serializer master clock generator comprises:

a clock divider that receives the four-phase internal clock and that produces a corresponding divided clock signal;

a first register having a data input, a clock input, and an output, wherein the clock input of the first register receives a first phase of the four-phase internal clock, wherein the data input of the first register receives the divided clock signal, and wherein the output of the first register is coupled to the global distribution path and provides a first of the two phases of the two-phase global serializer master clock;

a second register having a data input, a clock input, and an output, wherein the clock input of the second register receives a second phase of the four-phase internal clock that is inverted with respect to the first phase of the four-phase internal clock, wherein the output of the second register is coupled to the global distribution path and provides a second of the two phases of the two-phase global serializer master clock; and first and second delay elements coupled to corresponding first and second internal clock outputs, wherein the first delay element receives the first phase of the four-phase internal clock and compensates for a clock-to-output delay associated with the first register, wherein the second delay element receives the second phase of the four-phase internal clock and compensates for a clock-to-output delay associated with the second register, and wherein the serializer associated with each serial communications channel comprises:

a first serializer that converts a first half of the parallel data to serial data, wherein the first serializer has a plurality of registers each of which receives a respective input signal in the first half of the parallel data and each of which has a clock input and wherein the plurality of registers have outputs;

a second serializer that converts a second half of the parallel data to serial data, wherein the second serializer has a plurality of registers each of which receives a respective input signal in the second half of the parallel data and each of which has a clock input and wherein the plurality of registers have outputs;

a 2:1 serializer that receives the serial data from the register outputs of the first serializer and the serial data from the register outputs of the second serializer and that merges the serial data from the first serializer and the serial data from the second serializer to produce the serial data for the serial communications channel;

a first register having a clock input, a data input, and an output, wherein the data input of the first register receives a first phase of the two-phase global serializer master clock over the global distribution path, wherein the clock input of the first register receives the first phase of the internal clock from the first delay element, and wherein the output of the first register provides a first serializer master clock to the first serializer;

a second register having a clock input, a data input, and an output, wherein the data input of the second register receives a second phase of the two-phase global serializer master clock over the global distribution path, wherein the clock input of the second register receives the second phase of the internal clock, and wherein the output of the second register provides a second serializer master clock to the second serializer;

synchronous delay circuitry in the first serializer that receives the first serializer master clock and that derives a plurality of corresponding clocks that are applied respectively to the clock inputs of the registers in the first serializer; and synchronous delay circuitry in the second serializer that receives the second serializer master clock and that derives a plurality of corresponding clocks that are applied respectively to the clock inputs of the registers in the second serializer.

14. The integrated circuit defined in claim 1 wherein the two-phase global serializer master clock generator comprises first and second registers and wherein the serializer associated with each serial communications channel comprises:

a first serializer that converts a first half of the parallel data to serial data;

a second serializer that converts a second half of the parallel data to serial data; and a 2:1 serializer that receives the serial data from the first serializer and the serial data from the second serializer and that merges the serial data from the first serializer and the serial data from the second serializer to produce the serial data for the serial communications channel.

15. The integrated circuit defined in claim 1 wherein the two-phase global serializer master clock generator comprises:

a first register having a data input, a clock input, and an output, wherein the output of the first register is coupled to the global distribution path and provides a first of the two phases of the two-phase global serializer master clock; and a second register having a data input, a clock input, and an output, wherein the output of the second register is coupled to the global distribution path and provides a second of the two phases of the two-phase global serializer master clock and wherein the serializer associated with each serial communications channel comprises:

a first serializer that converts a first half of the parallel data to serial data;

a second serializer that converts a second half of the parallel data to serial data; and a 2:1 serializer that receives the serial data from the first serializer and the serial data from the second serializer and that merges the serial data from the first serializer and the serial data from the second serializer to produce the serial data for the serial communications channel.

16. The integrated circuit defined in claim 1 further comprising:

programmable core logic that produces the parallel data; and programmable elements that are loaded with configuration data and that produce static control signals that program the programmable core logic.

17. A method for using a plurality of serializers to convert parallel data into serial data in a plurality of respective serial communications channels on an integrated circuit comprising:

generating a two-phase global serializer master clock using a two-phase global serializer master clock generator;

distributing the two-phase global serializer master clock to each of the plurality of serializers using a two-phase global serializer master clock distribution path;

at each serializer, using first and second registers to generate corresponding first and second serializer master clocks from the two-phase global serializer master clock;

at each serializer, deriving a plurality of first associated clocks from the first serializer master clock and deriving a plurality of second associated clocks from the second serializer master clock;

at each serializer, using first and second banks of registers to receive respective first and second sets of parallel data from core logic on the integrated circuit;

at each serializer, applying the plurality of first associated clocks to the first bank of registers and applying the plurality of second associated clocks to the second bank of registers to convert the first and second sets of parallel data to corresponding first and second sets of serial data; and at each serializer, merging the first and second sets of serial data with a 2:1 serializer to form the serial data for the serial communications channel associated with that serializer.

18. The method defined in claim 17 wherein generating the two-phase global serializer master clock using the two-phase global serializer master clock generator comprises:

receiving a reference clock with a clock generation circuit;

generating an internal clock from the reference clock using the clock generation circuit;

generating a divided clock from the internal clock; and using the divided clock in generating the two-phase global serializer master clock.

19. The method defined in claim 17 wherein the two-phase global serializer master clock distribution path comprises a first conductive line and a second conductive line and wherein generating the two-phase global serializer master clock using the two-phase global serializer master clock generator comprises:

receiving a reference clock with a clock generation circuit;

generating an internal clock from the reference clock using the clock generation circuit;

generating a divided clock from the internal clock;

applying the divided clock to a first register in the two-phase global serializer master clock generator, wherein the first register has an output;

receiving a signal at the output of the first register in the two-phase global serializer master clock generator with a second register, wherein the second register has an output;

conveying signals from the output of the first register in the two-phase global serializer master clock generator to the first conductive line as a first phase of the two-phase global serializer master clock; and conveying signals from the output of the second register in the two-phase global serializer master clock generator to the second conductive line as a second phase of the two-phase global serializer master clock.

20. The method defined in claim 17 wherein the two-phase global serializer master clock distribution path comprises a first conductive line and a second conductive line and wherein generating the two-phase global serializer master clock using the two-phase global serializer master clock generator comprises:

receiving a reference clock with a clock generation circuit;

generating a four-phase internal clock from the reference clock using the clock generation circuit;

generating a divided clock from the four-phase internal clock;

applying the divided clock to a first register in the two-phase global serializer master clock generator, wherein the first register has a clock input and an output;

receiving a signal at the output of the first register in the two-phase global serializer master clock generator with a second register, wherein the second register has a clock input and an output;

applying a first of the four phases of the internal clock to the clock input of the first register;

applying a second of the four phases of the internal clock to the clock input of the second register, wherein the first phase of the internal clock and the second phase of the internal clock are inverses of each other;

conveying signals from the output of the first register in the two-phase global serializer master clock generator to the first conductive line as a first phase of the two-phase global serializer master clock; and conveying signals from the output of the second register in the two-phase global serializer master clock generator to the second conductive line as a second phase of the two-phase global serializer master clock.

* * * * *